(12) United States Patent
Aiken et al.

(10) Patent No.: US 7,381,886 B1
(45) Date of Patent: Jun. 3, 2008

(54) TERRESTRIAL SOLAR ARRAY

(75) Inventors: Daniel J. Aiken, Cedar Crest, NM (US); Gary Hering, Belle Mead, NJ (US); Earl Fuller, Albuquerque, NM (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 11/830,636

(22) Filed: Jul. 30, 2007

(51) Int. Cl.
*H01L 31/0232* (2006.01)

(52) U.S. Cl. ...................... 136/246; 136/255

(58) Field of Classification Search ............... 136/246, 136/255
See application file for complete search history.

(56) References Cited

U.S. PATENT DOCUMENTS

| | | | |
|---|---|---|---|
| 3,966,499 A * | 6/1976 | Yasui et al. ............ | 136/206 |
| 4,109,640 A | 8/1978 | Smith | |
| 4,574,659 A | 3/1986 | Arndt | |
| 4,585,318 A | 4/1986 | Seifert | |
| 5,622,078 A | 4/1997 | Mattson | |
| 6,080,927 A * | 6/2000 | Johnson .................. | 136/248 |
| 6,680,432 B2 | 1/2004 | Sharps et al. | |
| 2004/0112424 A1* | 6/2004 | Araki et al. ............. | 136/256 |

OTHER PUBLICATIONS

Stone, K.W. et al, "Design & Performance of the Amonix High Concentration Solar PV System", ASES/ASME National Solar Energy Conference. Reno, NV, 2002. (7 pages).*

Garboushian, V. et al, "A Novel High-Concentration PV Technology for Cost Competitive Utility Bulk Power Generation", Proc. 1st World Conference on Photovoltaic Energy Conversion. (1994) 1060-1063.*

Slade, A. et al, "High Efficiency Solar Cells for Concentrator Systems: Silicon or Multi-Junction?", SPIE Optics and Photonics. San Diego, CA, Aug. 2005. (8 pages).*

Stone, K.W. et al, "Operation of 350 kW of Amonix High Concentration PV Systems at Arizona Public Service", Proc. ISEC 2003, Hawaii, Mar. 15-18, 2003. p. 1-6.*

Sherif, R.A. et al, "First Demonstration of Multi-Junction Receivers in a Grid-Connected Concentrator Module", Conf. Rec. 31st IEEE Photovoltaic Specialists Conference. Jan. 3-7, 2005. 635-638.*

Cotal, H. et al, "Outdoor Operation of GaInP/GaAs/Ge Triple Junction Concentrator Solar Cells Up to 1000 Suns", 3rd World Conf. on Photovoltaic Energy Conversion. Osaka, Japan, May 11-18, 2003, 825-828.*

* cited by examiner

*Primary Examiner*—Nam X Nguyen
*Assistant Examiner*—Jeffrey T Barton (57) ABSTRACT

A concentrator photovoltaic solar cell array for terrestrial use for generating electrical power from solar radiation including a central support which is rotatable about its central longitudinal axis, a support frame carried by, and rotatable with respect to, the central support about an axis orthogonal to said central longitudinal axis, and a solar array mounted on the support frame. The solar cell array includes a plurality of Fresnel concentrator lenses and multijunction III-V compound semiconductor solar cells each producing in excess of 10 watts of DC power. An actuator is provided for rotating the central support and the support frame so that the solar cell array is maintained substantially orthogonal to the rays of the sun as the sun traverses the sky.

20 Claims, 7 Drawing Sheets

TERRESTRIAL SOLAR ARRAY

REFERENCE TO RELATED APPLICATIONS

This application is related to co-pending U.S. patent application Ser. Nos. 11/500,053 filed Aug. 7, 2006, and U.S. patent application Ser. No. 11/830,576 entitled "Solar Cell Receiver having an Insulated bypass Diode" filed simultaneously herewith by the common assignee.

BACKGROUND OF THE INVENTION

1. Field of the Invention

The present invention relates generally to a terrestrial solar power system for the conversion of sunlight into electrical energy, and, more particularly to a solar cell array using IV-V compound semiconductor solar cells for unitary movement to track the sun.

2. Description of the Related Art

Commercially available silicon solar cells for terrestrial solar power application have efficiencies ranging from 8% to 15%. Compound semiconductor solar cells, based on III-V compounds, have 28% efficiency in normal operating conditions. Moreover, it is well known that concentrating solar energy onto a III-V compound semiconductor photovoltaic cell increases the cell's efficiency to over 37% efficiency under concentration.

Terrestrial solar power systems currently use silicon solar cells in view of their low cost and widespread availability. Although III-V compound semiconductor solar cells have been widely used in satellite applications, in which their power-to-weight efficiencies are more important than cost-per-watt considerations in selecting such devices, such solar cells have not yet been designed for optimum coverage of the solar spectrum and configured or optimized for use in solar tracking terrestrial systems, nor have existing commercial terrestrial solar power systems been configured and optimized to utilize compound semiconductor solar cells.

In the design of both silicon and III-V compound semiconductor solar cells, one electrical contact is typically placed on a light absorbing or front side of the solar cell and a second contact is placed on the back side of the cell. A photoactive semiconductor is disposed on a light-absorbing side of the substrate and includes one or more p-n junctions, which creates electron flow as light is absorbed within the cell. Grid lines extend over the top surface of the cell to capture this electron flow which then connect into the front contact or bonding pad.

One important aspect of a solar cell system is the physical structure of the semiconductor material layers constituting the solar cell. Solar cells are often fabricated in vertical, multijunction structures to utilize materials with different bandgaps and convert as much of the solar spectrum as possible. One type of multijunction structure useful in the design according to the present invention is the triple junction solar cell structure consisting of a germanium bottom cell, a gallium arsenide (GaAs) middle cell, and an indium gallium phosphide (InGa P) top cell.

Still another aspect of a solar cell system is the specification of the number of cells used to make up an array, and the shape, aspect ratio, and configuration of the array.

The individual solar cells are typically disposed in horizontal arrays, with the individual solar cells connected together in electrical series. The shape and structure of an array, as well as the number of cells it contains, and the sequence of electrical connections between cells are determined in part by the desired output voltage and current of the system.

Another aspect of terrestrial solar power system is the use of light beam concentrators (such as lenses and mirrors) to focus the incoming sunrays onto the surface of a solar cell or solar cell array. The geometric design of such systems also requires an appropriate solar tracking mechanism, which allows the plane of the solar cells to continuously face the sun as the sun traverses the sky during the day, thereby optimizing the amount of sunlight impinging upon the cell.

Prior to the present invention, there has not been an optimal combination of features relating to array design, solar cell receiver modules, and semiconductor device features suitable for terrestrial applications.

SUMMARY OF THE INVENTION

1. Objects of the Invention

It is an object of the present invention to provide an improved solar cell array utilizing a III-V compound semiconductor multijunction solar cells for terrestrial power applications.

It is still another object of the invention to provide a plurality of series connected receivers each with a III-V semiconductor solar cell in a Fresnel lens based solar concentrator subarray for terrestrial power applications.

It is still another object of the invention to provide an array of III-V semiconductor solar cell concentrator modules with a solar tracker for terrestrial power applications.

It is still another object of the invention to provide a terrestrial solar power system constituted by a plurality of solar cell arrays each mounted on a post to track the sun, wherein each array is sized and spaced apart from each other over the ground so as to maximize the number of cells that can be implemented over a given ground area.

It is an object of the invention to provide a solar cell array system in which a single solar tracking tower produces 25 kW of peak DC power for terrestrial power applications.

2. Features of the Invention

The present invention provides a solar cell array for producing energy from the sun, including a central support mountable on the ground capable of rotation about its central longitudinal axis; a support frame carried by, and rotatable with respect to, the central support about an axis orthogonal to said central longitudinal axis; a solar cell array, preferably a plurality of solar cell subarrays mounted on the support frame; and an actuator for rotating the central support and the support frame so that the solar cell array is maintained substantially orthogonal to the rays from the sun as the sun traverses the sky.

Preferably, the solar cell subarrays include a plurality of modules or subassemblies, each module including a single Fresnel lens disposed over a single solar cell for concentrating the incoming sunlight onto the solar cell.

In a preferred embodiment, the solar cell array comprises the plurality of solar subarrays arranged in a rectangular matrix with ten subarrays disposed in the x direction parallel to the ground surface. Each subarray is mounted vertically on the support in the y direction orthogonal to the x direction.

Advantageously, the central support is constituted by a first member provided with means for mounting the central support on the ground, and a second member rotatably supported by, and extending upwardly from, the first member.

Preferably, the support frame is mounted on a cross member which is rotatably mounted with respect to the second member of the central support about an axis orthogonal to said central longitudinal axis.

In a preferred embodiment, the support frame is constituted by a generally rectangular frame member which is provided with a plurality of parallel support struts which are parallel to the shorter sides of the rectangular frame member. In this case, the panel may further comprise support arms, each of which extends between a respect one of said support struts and said inner member.

Additional objects, advantages, and novel features of the present invention will become apparent to those skilled in the art from this disclosure, including the following detailed description as well as by practice of the invention. While the invention is described below with reference to a preferred embodiment, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The present invention relates generally to a terrestrial solar power system for the conversion of sunlight into electrical energy utilizing a plurality of mounted arrays spaced in a grid over the ground, to the optical size and aspect ratio of the solar cell array mounted for unitary movement on a cross-arm of a vertical support that tracks the sun, and to the design of the subarrays, modules or panels that constitute the array.

Figure 1:
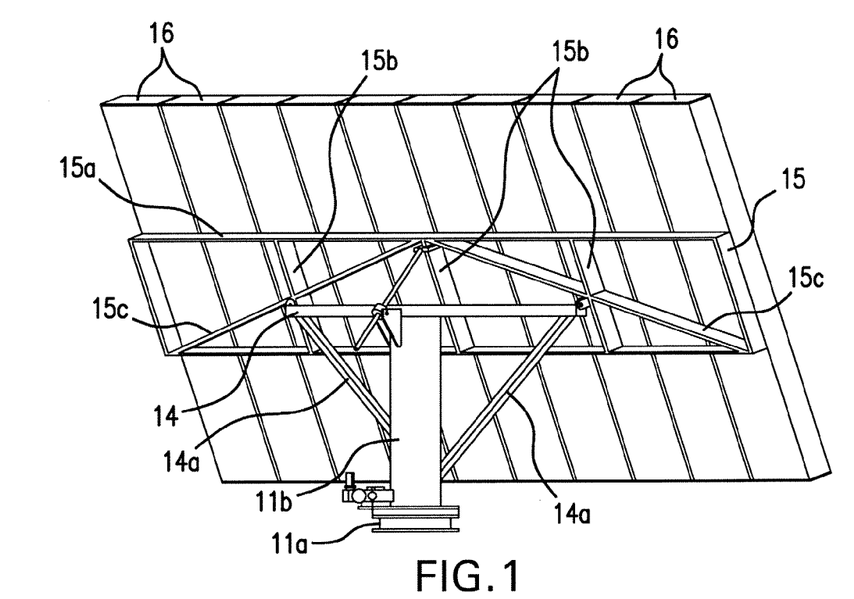
FIG. 1 is a perspective view of a terrestrial solar cell system constructed in accordance with the present invention.
Figure 2:
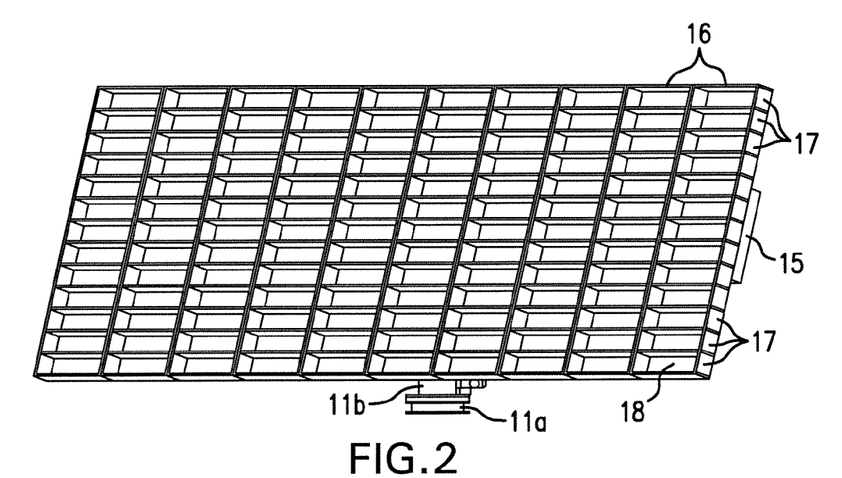
FIG. 2 is a perspective view of the solar cell system of FIG. 1 viewed from the opposite side thereof.

In one aspect, the invention relates to the design of a solar tracking system and array of solar cell modules as depicted in FIG. 1. This system has a central support constituted by a first member 11a and a second member 11b. The member 11a is a generally hollow cylindrical member which is connectable to a support mounted on the ground by means of the bolts (not shown). The member 11b is rotatably mounted within the member 11a, and supports a cross member 14 which is connected to a support frame 15. The support frame 15 is constituted by a rectangular frame 15a, three parallel support struts 15b which are parallel to the shorter ends of the frame 11a, and two diagonal bracing struts 15c. The support frame 15 is also supported on the inner member 11b by a pair of inclined arms 14a which extend respectively from two of the support struts 15b to the base of the inner member. A further support arm 14b extends from the top of the inner member 11b to the central support strut 15b. The mounting of the support frame 15 in this manner ensures that it is fixed to the top of the second member 11b of the central support in such a manner that it is rotatable about its central longitudinal axis through members 11a and 11b.

The support frame 15 supports a solar cell array constituted by a horizontal sequence of ten solar cell subarrays or panels 16. Each of the solar cell subarrays is constituted by a vertical stack of thirteen solar modules 17. A Fresnel lens 20 is provided facing away from the support frame 15 and disposed over a single receiver 18. The receiver, a printed circuit or subassembly 19, includes a single III-V compound semiconductor solar cell 19 facing towards the support frame, together with additional circuitry such as a bypass diode (not shown).

Figure 3:
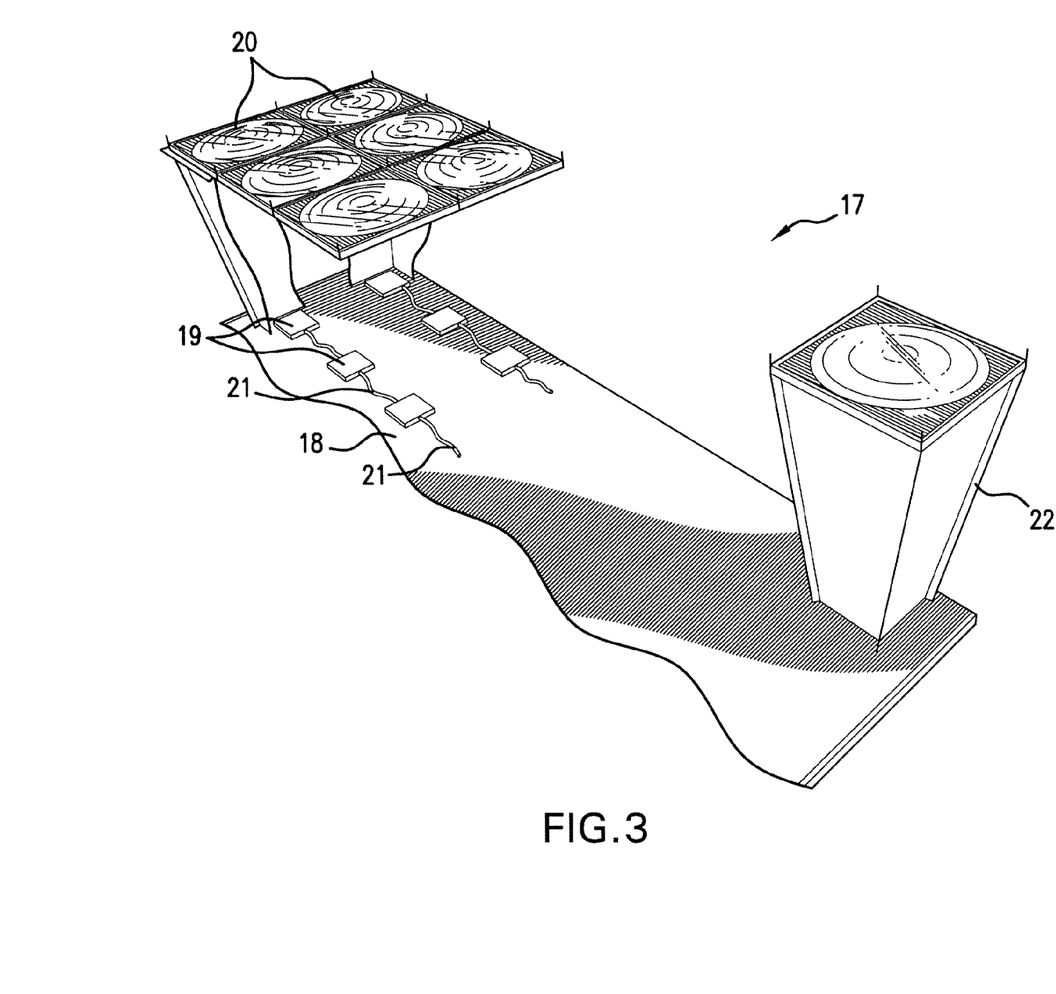
FIG. 3 is an enlarged perspective view of a portion of solar cell subarray utilized in the system of FIG. 1.

FIG. 3 is a cutaway view of a solar cell subarray 17 according to the present invention, more particularly depicting a module 17. Each module 17 is constituted by a 2×7 matrix of solar cells receivers. Each module includes a tapered support 22, a nine-inch by nine-inch square Fresnel lens 20 at one end of the support 22, and a receiver 19 at the other end of the support 22. The supports 22 are mounted on a base 18 on which the receivers 19 are also mounted, and which serves to dissipate heat from the receivers, and more particularly from the individual solar cells.

Figure 4:
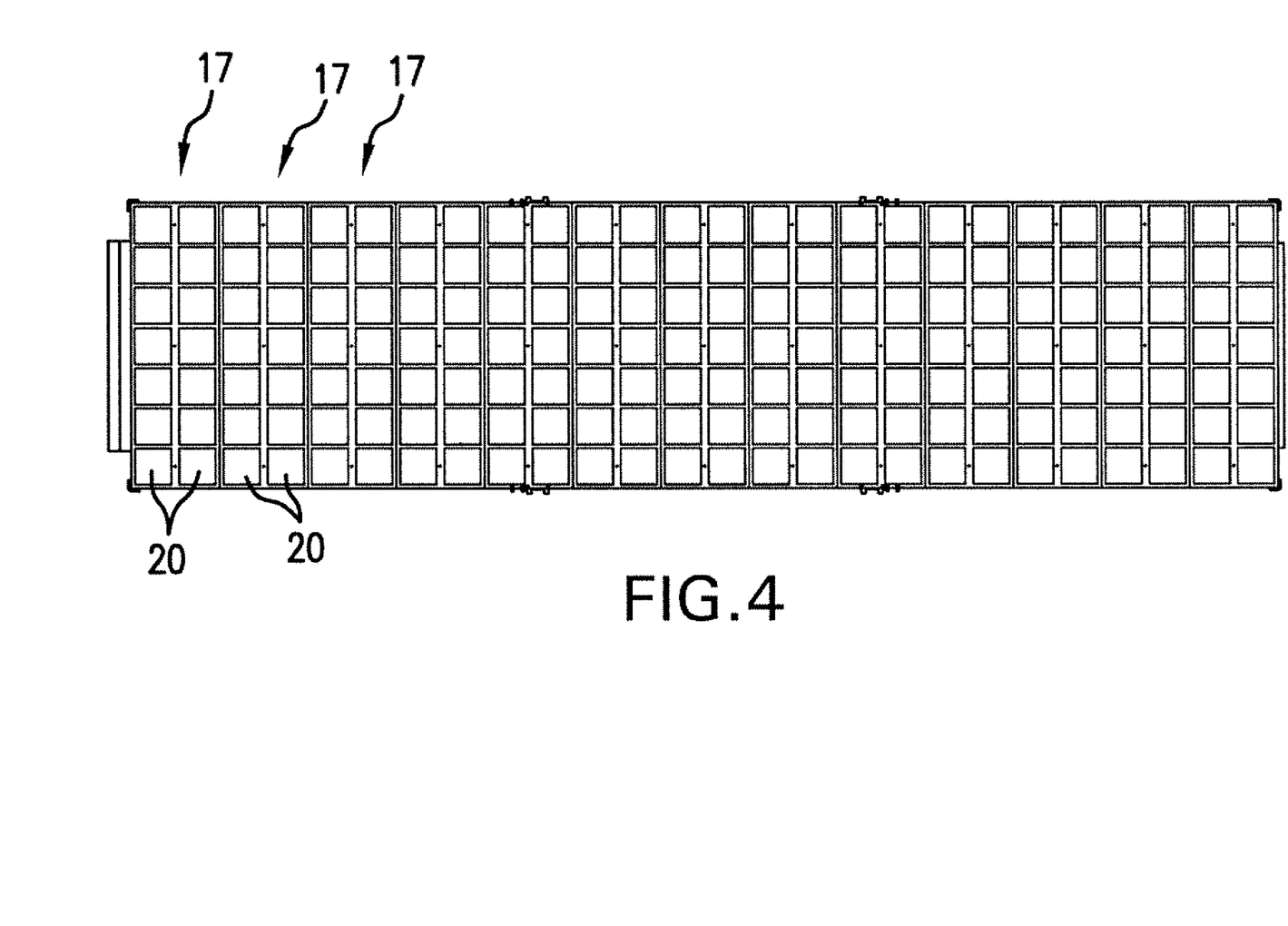
FIG. 4 is a top plan view of a single solar cell subarray.

In the preferred embodiment, as illustrated in the plan view of FIG. 4, the subarray is about 282 inches high and 71 inches wide and is constituted by a 7×26 matrix of Fresnel lenses and receivers 19. Each receiver 19 produces over 10 watts of DC power on full AM 1.5 solar irradiation. The receivers are connected by electrical cables in parallel or in series, so that the aggregate 182 modules in an entire subarray will produce in excess 1820 watts of peak DC power. Each of the subarrays are in turn connected in series, so that a typical array 1b would produce in excess of 18 kW of power. In the preferred embodiment, 25 kW of peak DC power is produced.

A motor (not shown) provides drive to rotate the member 11b relative to the outer 11a, and another motor (not shown) provides drive to rotate the cross member 14 (and hence the support frame 15) relative to the central support 11 about its longitudinal axis. Control means (not shown) are provided for controlling rotation of the inner 11b relative to the member 11a, and for controlling rotation of the cross member 14 (and the support frame 15) about its axis to ensure that the planar exterior surface of each of the modules 17 constituted by the Fresnel lenses 18 is orthogonal to the sun's rays. The control means is preferably computer controlled, using software that controls the motors in dependence upon the azimuth and elevation of the sun relative to the system. Each of the Fresnel lenses 18 concentrates incoming sunlight onto the associated solar cell 19 in a respective receiver by a factor of over 500×, thereby enhancing the conversion of sunlight into electricity with a conversion efficiency of over 37%. In the preferred embodiment, the concentration is 520×.

The system is refractive and uses an Acrylic Fresnel lens to achieve 520× concentration with an f# of approximately 2. A reflective secondary optical element is used. An acceptance angle for an individual cell/optics system is +/−1.0 degrees. The efficiency of the optical system on-sun is 90% with the acceptance angle defined at a point where the system efficiency is reduced by no more than 10% from its maximum. Each solar cell is assembled in a ceramic package that includes a bypass diode and a two-pin connector. 182 cells are configured in a sub array. Voltages add to provide the minimum system voltage to operate at an appropriate inverter voltage. Each sub array of 182 cells is connected in parallel with nine other sub arrays through an isolation diode. These 10 sub arrays make up an array that produces approximately 55A at 458V.

The design of the receiver is more particularly described in U.S. patent application Ser. No. 11/830,576, entitled Solar Cell Receiver Having an Insulated Bypass Diode, filed simultaneously herewith and herein incorporated by reference.

The design of the semiconductor structure of the triple junction III-V compound semiconductor solar cell is more particularly described in U.S. Pat. No. 6,680,432 herein incorporated by reference. Since such cells are described as optimized for space (AM0) solar radiation, one aspect of the present invention is the modification or adaptation of such cell designs for concentrator photovoltaic applications under terrestrial (AM 1.5) solar spectrum according to the present invention.

The solar cell is a triple junction device, with the top junction based on InGaP, the middle on GaAs, and the bottom of Ge. Typical band-gaps for the cell are 1.9 eV/1.4 eV/0.7 eV, respectively. Typical cell performance as a function of temperature indicate that Voc changes at a rate of −5.9 mV/C and, with respect to temperature coefficient, the cell efficiency changes by −0.06%/C absolute.

Figure 9:
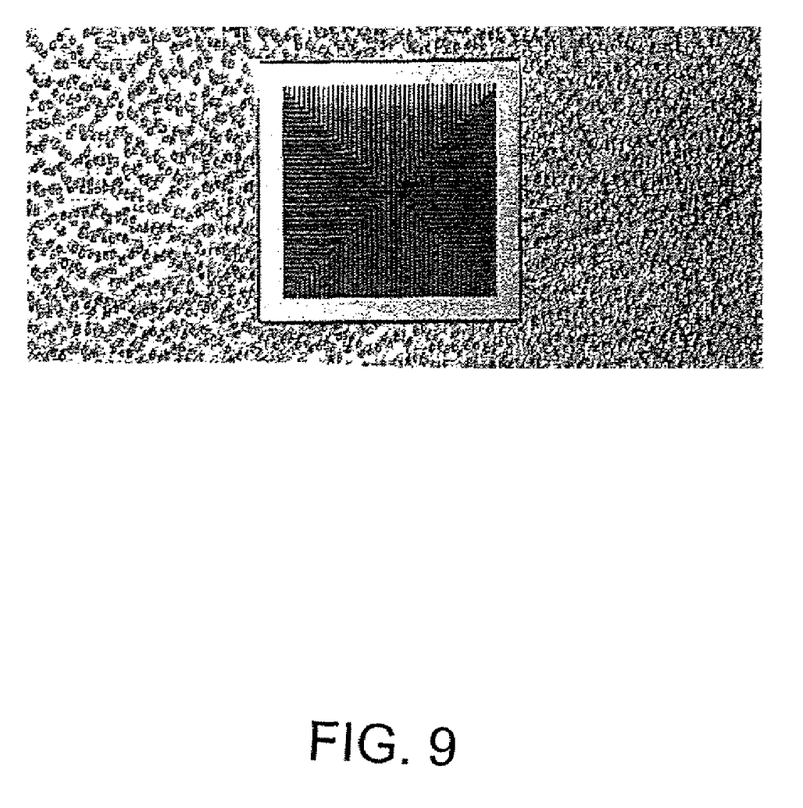
FIG. 9 is a top plan view of a solar cell according to the present invention depicting the grid pattern.

As noted in the background discussion, one electrical contact is typically placed on a light absorbing or front side of the solar cell and a second contact is placed on the back side of the cell. A photoactive semiconductor is disposed on a light-absorbing side of the substrate and includes one or more p-n junctions, which creates electron flow as light is absorbed within the cell. Grid lines extend over the top surface of the cell to capture this electron flow which then connect into the front contact or bonding pad. One aspect of the present invention is to maximize the number of grid lines over the top surface of the cell to increase the current capacity without adversely interfering with light transmission into the active semiconductor area. One embodiment is to utilize a dense grid pattern with 4-fold rotational symmetry to achieve this objective, as shown in FIG. 9.

Another aspect of the present invention is to maximize or optimize the amount of electricity generated from solar power by appropriate sizing of each array and locating each tower or post with predetermined spacing in a regular lattice or grid within a predetermined ground area. Such sizing (including orientation of the array and aspect ratio) is intended to maximize the number of cells that can be mounted on the flat roof of a building or on an area of ground. Each of the posts must be positioned sufficiently far away from other posts as not to be shadowed by the moving array mounted on adjacent posts.

In such an arrangement, dual-axis tracking of the rectangular array changes the tilt angle of each solar cell array throughout each day of the year in any given location. Accordingly, the shadow cast by each array varies, so that the posts must be spaced far enough apart to avoid one array shadowing another array, as this would reduce the total illumination to the arrays, and consequently reduce the electrical output of the arrays.

The shadow cast by a given rectangular array depends on the size and shape of that system, and also on the location of the sun in the sky. In the East-West direction, the sun location can vary by up to 150°. In this connection, it should be noted that it is generally accepted that, where the elevation of the sun is below 15° above the horizon, its rays are of insufficient strength to generate a useful amount of electricity. The latitude at which an array of systems S is positioned is, therefore, of little influence.

In the North-South direction, the sun location varies by 46°, given that the earth's axis is tilted at an angle of 23° with respect to its orbit around the sun. In this connection, it will be appreciated that latitudes below 23° are subject to different conditions, and that latitudes above 45° are probably not relevant due to poor direct normal insolation (DNI) levels, as known to those skilled in the art.

FIGS. 5 to 8 illustrate another aspect of the invention, in which shadowing problems are prevented or minimized for a minimized land use for a given arrangement of systems S. The requirements for correct spacing of the posts are that each of the arrays of the arrangement is fully illuminated for all positions where the sun is 15° above the horizon, and that there is no shadowing of any given array by any other array. In this connection, it will be appreciated that shadow length is minimized where each system S has a minimized array height, and this depends on the aspect ratio of each system, the aspect ratio being defined by the ratio of the width of the system with respect to its height. Thus, a system having an aspect ratio of 1:1 (1 to 1) is square in configuration, whereas a system having an aspect ratio of 1:4 is constituted by a rectangle whose height is one quarter its width.

Figure 5:
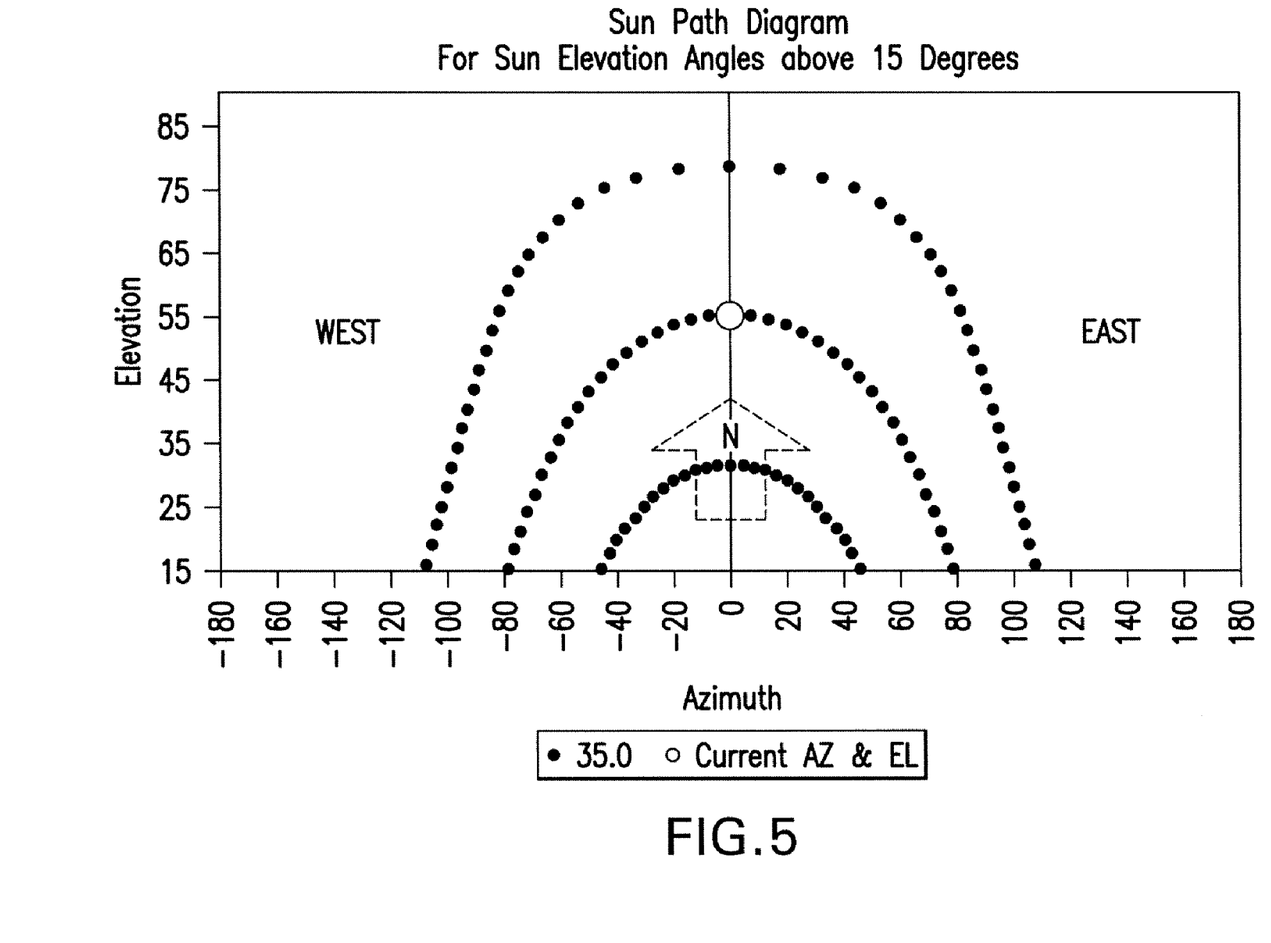
FIG. 5 is a diagram illustrating the sun's path on the earth as a function of elevation and azimuth.

More particularly, FIG. 5 is a sun path diagram showing the elevation of the sun for all angles above 15° at a latitude of 35° North. The graph shows the sun path for three times of the year, namely at the summer solstice (indicated by the highest dotted line), at the winter solstice (indicated by the lowest dotted line), and at the equinoxes (indicated by the middle dotted line). At all other dates, the sun path falls within the envelope defined by the highest and lowest dotted lines. Thus, at the winter solstice, the sun path goes from a negative azimuth angle of about 45° to a positive azimuth angle of about 45°, and from an elevation of 15° to about 37°, and then back to 15°. Similar ranges are apparent for a sun path at the summer solstice and at the equinoxes.

Figure 6:
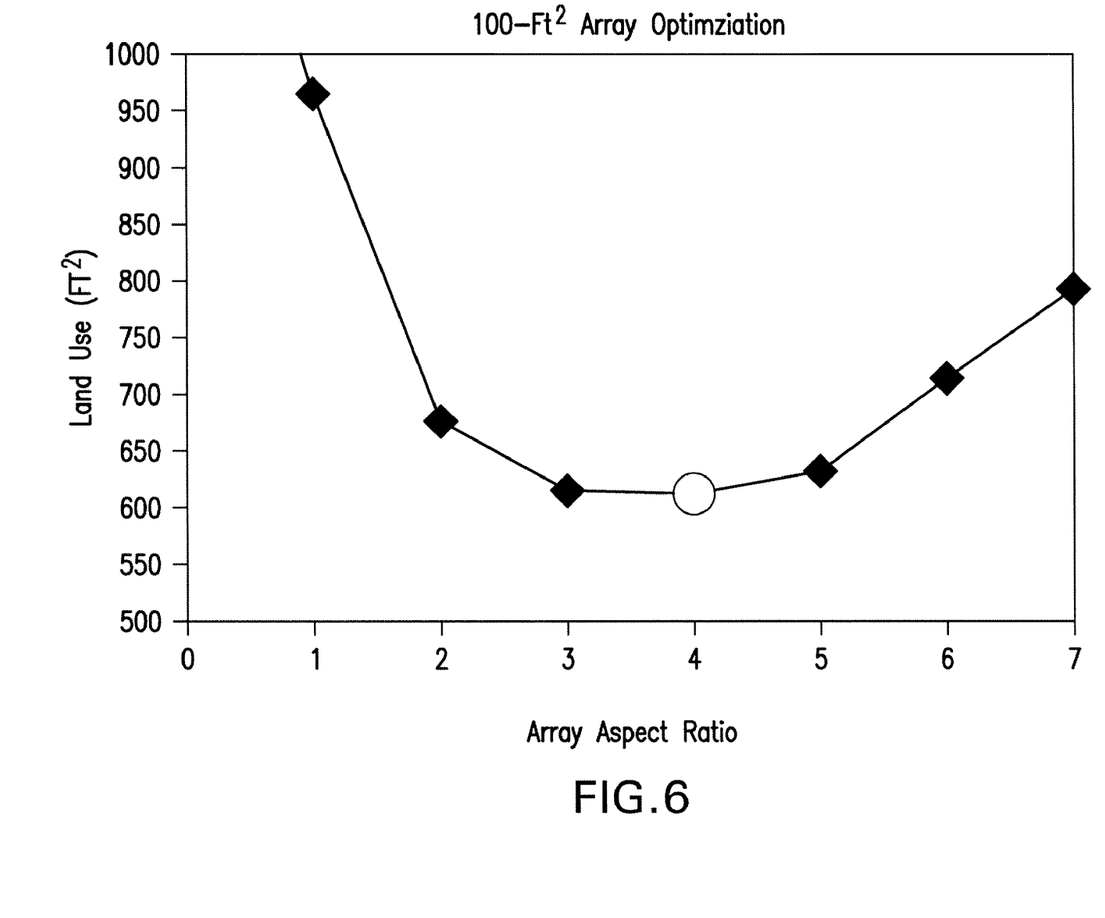
FIG. 6 is a graph that shows the amount of land use for an array of different aspect ratios.

FIG. 6 illustrates this optimization for an arrangement of systems each having an effective area of 100 square feet, from which it will be noted that an aspect ratio of between 1:3 and 1:5 is most advantageous, with an aspect ratio of 1:4 being marginally better than 1:3 or 1:5, and significantly better than 1:1, 1:2, 1:6 or 1:7.

Figure 7:
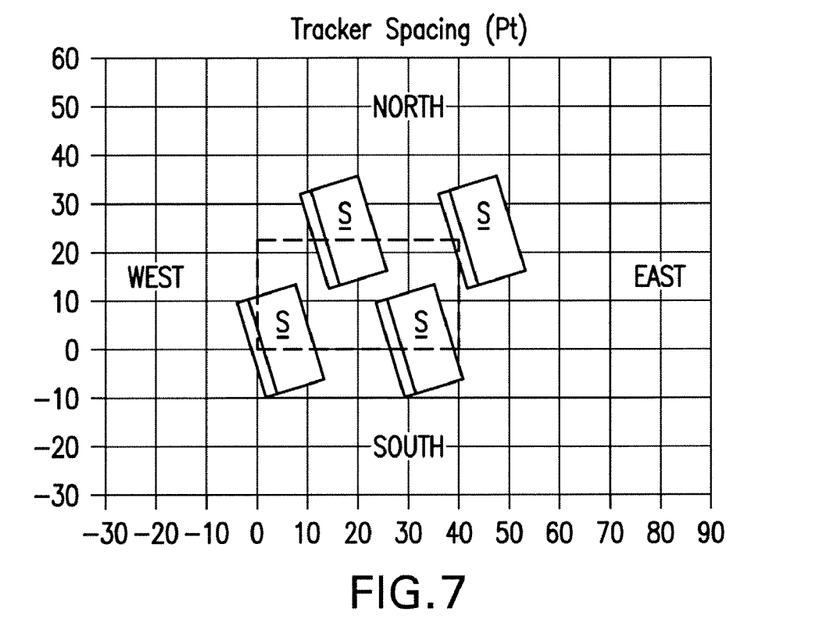
FIGS. 7 and 8 are diagrams illustrating optimum post spacing or lattice positions for positioning the arrays over a ground area.
Figure 8:
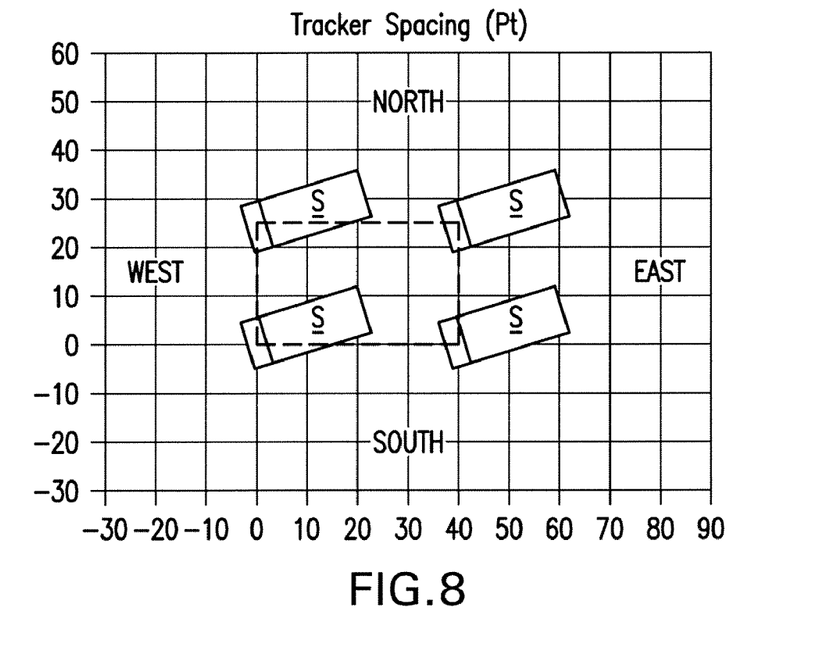

FIGS. 7 and 8 illustrate the positioning of an arrangement having four systems S having aspect ratios of 1:4 and 1:5 respectively. As will be apparent, by comparing FIGS. 7 and 8, the East-West spacing of four systems S, each having an aspect ratio of 1:5, is about 40 feet, and the North-South spacing for this aspect ratio is about 25 feet. This is to be compared with an East-West spacing of about 30 feet and a North-South spacing of about 20 feet for solar systems having as aspect ratio of 1:4. Clearly, therefore, systems having an aspect ratio of 1:4 provides better land use than systems having an aspect ratio of 1:5. The aspect ratio of a given system S can be varied by varying the number of subarrays positioned on the frame 15.

It will be apparent that, in practice, the arrangement could have substantially more systems S than the four illustrated. The systems S of such an enlarged arrangement would, however, be arranged in a regular grid pattern.

Although this aspect of the invention has been described in a certain specific embodiment of semiconductor structures, receiver designs, and array structures, many additional modifications and variations would be apparent to those skilled in the art. This aspect of the present invention is, therefore, considered in all respects to be illustrative and not restrictive. The scope of this aspect of the invention is indicated by the relevant appended claims, and all changes that come within the meaning and range of equivalents thereof are intended to be embraced therein.

It will be understood that each of the elements described above, or two or more together, also may find a useful application in other types of terrestrial solar cell systems and constructions differing from the types described above.

While the aspect of the invention has been illustrated and described as embodied in a solar cell array using III-V compound semiconductors, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and therefore, such adaptations should and are intended to be comprehended within the meaning and range of equivalence of the following claims.

The invention claimed is:

1. A concentrator photovoltaic solar cell array system for producing energy from the sun using a plurality of sun-tracking solar cell arrays, each array comprising:

a central support having a stationary first member and second member, the first member being hollow and cylindrical and mountable on the ground, and a first, base end of the second member mounted within the cylindrical first member, the second member extending from the ground mountable first member and being capable of rotation relative to the stationary first member about its central longitudinal axis;

a pair of inclined arms that extend respectively from the base end of the second member;

a support frame carried by a second, opposing end of the second member and the pair of inclined arms, the support frame being rotatable with respect to the central support about an axis orthogonal to said central longitudinal axis;

a generally rectangular planar solar cell array having a predetermined aspect ratio for producing in excess of 18 kW peak DC power on full illumination including a plurality of triple junction III-V semiconductor compound concentrator solar cell receivers mounted on the support frame; and an actuator for rotating the central support and the support frame so that the solar cell array is maintained substantially orthogonal to the rays from the sun as the sun traverses the sky.

2. A system as claimed in claim 1, wherein the solar cell array comprises a plurality of solar cell modules, each module including a single Fresnel lens disposed over a single solar cell for concentrating by a factor in excess of 500× the incoming sunlight onto the solar cell and producing in excess of 10 watts of DC power at AM 1.5 solar irradiation with conversion efficiency in excess of 37%, said module including a tapering support with the single Fresnel lens on one end and solar cell at the other end to focus light on the solar cell.

3. A system as claimed in claim 2, wherein the solar cell array comprises a plurality of subarrays each subarray consisting of a portion of the plurality of solar modules arranged in a rectangular matrix with thirteen modules in a first matrix direction, and twenty six modules in a second matrix direction orthogonal to the first matrix direction.

4. A system as claimed in claim 3, wherein the central support is constituted by the first member provided with means for mounting the central support on the ground, and the second member rotatably supported by, and extending upwardly from, the first member to support the support frame and solar array in a spaced apart relationship with the first member.

5. A system as claimed in claim 4, wherein the support frame is mounted on a cross member which is rotatably mounted with respect to the second member of the central support about an axis orthogonal to said central longitudinal axis.

6. A system as claimed in claim 5, wherein the support frame is constituted by a generally rectangular frame member which is provided with a plurality of parallel support struts which are parallel to the shorter sides of the rectangular frame member for supporting a plurality of subarrays.

7. A system as claimed in claim 6, further comprising a plurality of support arms, each of which extends between a respect one of said support struts and said second member.

8. A system as claimed in claim 1 wherein the predetermined aspect ratio further comprises an aspect ratio between 1:3 and 1:5.

9. A system as claimed in claim 1 wherein the predetermined aspect ratio further comprises an aspect ratio between 1:2 and 1:5.

10. A system as claimed in claim 1 wherein the solar cell receivers comprise (i) a solar cell consisting of a germanium bottom cell, a gallium arsenide middle cell, and an indium gallium phosphide top cell; (ii) an insolated bypass diode connected in parallel with the solar cell; and (iii) a connector for allowing the receivers to be connected to each other in an electrical circuit.

11. A system as claimed in claim 1 wherein the plurality of sun-tracking solar cell arrays further comprise a plurality of central supports mounted on the ground in a lattice pattern to optimize the amount of solar cells on the array in a given ground area and minimize land use of the plurality of solar cell arrays.

12. A concentrator photovoltaic solar cell array system for producing energy from the sun using a plurality of sun-tracking solar cell arrays, comprising:

a plurality of central supports mounted on the ground in a lattice pattern to optimize the amount of solar cells on the array in a given ground area and minimize land use of the plurality of solar cell arrays, each support having a stationary first member, the first member being hollow and cylindrical and a second member, with a base portion of the second member mounted within the hollow first member, the second member extending from the stationary first member and being capable of rotation relative to the first member about its central longitudinal axis;

each support having a pair of inclined arms that extend respectively from the base end of the second member;

each support having a support frame carried a second opposing end of the second member and the pair of inclined arms, the support frame being rotatable with respect to the central support about an axis orthogonal to said central longitudinal axis;

a rectangular solar cell array having a predetermined aspect ratio, with the longitudinal of the array parallel to the ground for producing in excess of 18 kW peak DC power on full illumination and including a plurality of triple junction III-V semiconductor compound solar cell receivers mounted on the support frame; and an actuator for rotating the central support and the support frame so that the solar cell array is maintained substantially orthogonal to the rays from the sun as the sun traverses the sky and wherein the lattice pattern that minimizes land use for the plurality of arrays includes a spacing between each of the plurality of central supports based upon the aspect ratio so that each of the arrays is fully illuminated for all positions wherein the sun is fifteen or more degrees above the horizon and there is no shadowing of any given array by any other array.

13. A system as claimed in claim 12, wherein the solar cell array comprises ten subarrays, each with a seven by twenty-six matrix of solar cell modules connected together in series or parallel, each module including a single nine inch by nine inch Fresnel lens disposed over a single solar cell receiver and supported by a tapering support for concentrating by a factor in excess of 500× the incoming sunlight onto the solar cell and producing in excess of 10 watts of DC power at AM 1.5 solar irradiation with conversion efficiency in excess of 37%, wherein the tapered support focuses light on the solar cell.

14. A system as claimed in claim 13, wherein the solar cell receiver comprises (i) a solar cell consists of a germanium bottom cell, a gallium arsenide middle cell, and an indium gallium phosphide top cell; (ii) an insolated bypass diode connected in parallel with the solar cell; and (iii) a connector for allowing the receivers to be connected to each other in an electrical circuit.

15. A system as claimed in claim 12 wherein the predetermined aspect ratio further comprises an aspect ratio between 1:3 and 1:5.

16. A system as claimed in claim 12 wherein the predetermined aspect ratio further comprises an aspect ratio between 1:2 and 1:5.

17. A concentrator photovoltaic solar cell array system for producing energy from the sun using a plurality of sun-tracking solar cell arrays, each array comprising:

a plurality of central supports, each having a first and second member, the first member being hollow and cylindrical and mountable on the ground, and a base portion of the second member mounted within the first member, the second member extending from the ground mountable first member and being capable of rotation about its central longitudinal axis; wherein each of the plurality of central supports further comprises:

a cross member supported by a second, opposing end of the second member;

a pair of inclined arms that extend respectively from opposing ends of the cross member to the base portion of the second member;

a support frame carried by the second, opposing end of the second member and the pair of inclined arms, and rotatable with respect to, the central supports about an axis orthogonal to said central longitudinal axis;

a rectangular solar cell array having a predetermined aspect ratio including a plurality of triple junction III-V semiconductor compound solar cells each cell including a triple junction solar cell for terrestrial applications comprising:

a germanium substrate including a first photoactive junction;

a gallium arsenide middle cell disposed on said substrate;

an indium gallium phosphide top cell disposed over said middle cell and having a bandgap to maximize absorption in the AM1.5 spectral region;

a surface grid having 4-fold rotational symmetry for conduction of the relatively high current created by the cell where grid lines of each quadrant of the surface grid extend outwardly substantially orthogonal to an adjacent edge;

an actuator for rotating the central support and the support so that the solar cell array is maintained substantially orthogonal to the rays from the sun as the sun traverses the sky; and a spacing between each of the central supports based upon the aspect ratio that optimizes the amount of solar cells in a given around area.

18. A system as claimed in claim 17, wherein the solar cell array comprises a plurality of solar cell modules, each module including a single Fresnel lens disposed over a single solar cell for concentrating by a factor in excess of 500× the incoming sunlight onto the solar cell and producing in excess of 10 watts of DC power at AM 1.5 solar irradiation with conversion efficiency in excess of 37% with a tapered support with the Fresnel lens at one end and the solar cell at the other end and wherein the tapered support focuses light on the solar cell.

19. A system as claimed in claim 17 wherein the predetermined aspect ratio further comprises an aspect ratio between 1:3 and 1:5.

20. A system as claimed in claim 17 wherein the predetermined aspect ratio further comprises an aspect ratio between 1:2 and 1:5.

* * * * *